United States Patent [19]

Watrobski

[11] Patent Number: 4,878,070

[45] Date of Patent: Oct. 31, 1989

[54] THERMAL INK JET PRINT CARTRIDGE ASSEMBLY

[75] Inventor: Thomas E. Watrobski, Rochester, N.Y.

[73] Assignee: Xerox Corporation, Stamford, Conn.

[21] Appl. No.: 258,957

[22] Filed: Oct. 17, 1988

[51] Int. Cl.⁴ .......................... G01D 15/16; B41J 3/04
[52] U.S. Cl. ................................ 346/140 R; 361/386;
361/398; 361/412
[58] Field of Search ................ 346/140; 361/413, 386,
361/388, 398, 412, 415, 414

[56] References Cited

U.S. PATENT DOCUMENTS

| | | | |
|---|---|---|---|
| 3,863,261 | 1/1975 | Klein | 361/398 X |
| 4,567,543 | 1/1988 | Miniet | 361/398 |
| 4,587,596 | 5/1986 | Bunnell | 361/398 |
| 4,601,777 | 7/1986 | Hawkins et al. | 156/626 |
| 4,791,440 | 12/1988 | Eldridge | 346/140 |

Primary Examiner—Joseph W. Hartary

[57] ABSTRACT

A thermal ink jet printer is provided with an improved interconnection between the heater elements in the printhead and the remote source for the thermal energy print signals. The printhead is bonded to a first electrode board which has a plurality of electrode leads formed on both surfaces. The leads connect to the input pads of the resistor heater elements and terminate at discrete points over a large portion of the boards' surface. The electrical connections to the remote source are completed via a second electrode board placed in a mechanical and electrical contact with the first board. Conductive raised pads on the second board are in alignment with the terminal pads on the first board and are held in pressure contact therewith.

8 Claims, 5 Drawing Sheets

THERMAL INK JET PRINT CARTRIDGE ASSEMBLY

BACKGROUND AND INFORMATION DISCLOSURE STATEMENT

The invention relates to thermal ink jet printing systems and, more particularly to a cartidge assembly for use in such a system which is constructed with improved electrical interconnections and thermal efficiency.

Thermal ink jet printers are well known in the prior art as exemplified by U.S. Pat. Nos. 4,463,359 and 4,601,777. In the systems disclosed in these patents, a thermal printhead comprises one or more ink-filled channels communicating with a relatively small ink supply chamber at one end and having an opening at the opposite end, referred to as a nozzle. A plurality of thermal energy generators, usually resistors, are located in the channels at a predetermined distance from the nozzle. The resistors are individually addressed with a current pulse to momentarily vaporize the ink and form a bubble which expels an ink droplet. As the bubble grows, the ink bulges from the nozzle and is contained by the surface tension on the ink as a meniscus. As the bubble begins to collapse, the ink still in the channel between the nozzle and bubble starts to move towards the collapsing bubble, causing a volumetric contraction of the ink at the nozzle and resulting in the separating of the bulging ink as a droplet. The acceleration of the ink out of the nozzle while the bubble is growing provides the momentum and velocity of the droplet in a substantially straight line direction towards a recording medium, such as paper.

There are several problems common to the fabrication of prior art printers. One problem is the electrical interconnection required between the printing device controller and the individual heating elements. An associated problem is the increase in temperature experienced by a printhead during an operational mode. A novel electrical interconnection is disclosed in the above identified U.S. Pat. No. 4,601,777 in which an ink supply cartridge and the printhead are maintained on an electrode, or daughter board. A prior art printing system incorporating this design, is shown in FIG. 1 of the present appliction. A linear array of ink droplet producing channels is housed in each printhead 11 of each ink supply cartridge 12. One or more ink supply cartridges are mounted on a reciprocating carriage assembly 14 which reciprocates back and forth in the direction of arrow 13 on guide rails 15. The channels terminate with orifices or nozzles aligned perpendicular to the carriage reciprocating direction and parallel to the stepping direction of the recording medium which is stepped by the printing device a distance equal to the pinted swath in the direction of arrow 17. The printhead then moves in the opposite direction printing another swath of information. Droplets 18 are expelled and propelled to the recording medium from the nozzles in response to digital data signals received by the printing device controller (not shown), which in turn selectively addresses the individual heating elements, located in the printhead channels a predetermined distance from the nozzles, with a current pulse. The current pulses passing through the printhead heating elements vaporize the ink contacting the heating elements and produce temporary vapor bubbles to expel droplets of ink from the nozzles.

Several ink supply cartridges 12 and fixedly mounted electrode board or daughter boards 19 are shown in which, sandwiched therebetween, are printheads 11, one of which is shown in dashed line. The printhead is permanently attached to electrode board 19 and their respective electrodes are wire-bonded together, A printhead fill hole 25, shown in FIG. 2, is sealing positioned against and coincident with an aperture (not shown) in the cartridge, so that ink from the cartridge is continuously supplied to the ink channels via the manfold during operation of the printing device.

A plan view of an electrode board 19 and printhead 11 is shown in FIG. 2. The electrode board electrodes 23 are on a one - to - one ratio with the electrodes on the opposite side of the board electrically connected at locations 26. Electrodes 33 are connected to individual heating resistors 34 within the printhead, several of which are shown as dotted lines. Each resistor 34 is associated with a droplet-emitting nozzle.

Electrodes 33 all terminate at electrical terminals 21 at the edge of the daughterboard. Further interconnection is made to a card edge connector. In a typical connection, 50 electrical connections are made from the resistor to terminals 21. This results in a high line density requiring a high-cost photo-definition process. The high density also contributes to a temperature buildup which must be dissipated by the introduction of heat sinks or the like.

Prior art references which are considered as containing subject matter material to the invention are found in U.S. Pat. No. 3,863,261 to Klein; U.S. Pat. No. 4,567,543 to Miniet and U.S. Pat. No. 4,587,596 to Bunnell. Klein discloses an electrically-addressed, apertured modulator for electrostatic printing including a flexible circuit board edge connector. The circuit board is constructed of a thin flexible substrate with a continuous electrically conducting layer applied to one surface and a plurality of electrically isolated conductive segments applied to the opposite surface. Each segment provides an electrically conductive circuit between a modulating aperture and a contact pad. Miniet discloses a double-sided flexible electronic circuit module having a flexible printed circuit board and a carrier member. Apertures in both members are in alignment with each other and connected by a plurality of conductive paths on each surface. Connector pins are affixed to the flexible board by high temperature solder and consequently facilitate the connection of the completed circuit module. Bunnell discloses a high density mother/daughter circuit board connector including a multi-layer flat flexible circuit containing a plurality of patterned array circuit paths on each layer. The circuits of the boards are preferably terminated by a plurality of contact pads 20, 22 (in FIGS. 1 and 2) which protrude from the respective surfaces in a patterned array and which provide alignment of the different circuit board layers.

The present invention is directed to an improved design for a printing device of the type shown in FIGS. 1, 2. More particularly, the high electrical conductor line density is reduced by using an improved daughterboard reduced in size and modified so as to terminate the electrode along the top and bottom surfaces of the board. A second, flexible printed circuit is aligned with the daughterboard, the printed circuit effectively replacing the card edge connector of the prior art. The ink cartridge, printhead, daughter board and flexible printed circuit board are accurately aligned by a plurality of accurately drilled alignment holes. Since the electrical terminations are now dispersed throughout a larger layer area, the packing density is reduced, permitting the conductive material to be formed by a relatively less expensive screen print process. Thermal performance is enhanced by fabricating plating holes through the daughterboard to a heat sink. More particularly, the present invention is directed towards an ink jet printing device for a drop-on-demand thermal ink jet printer, the printing device including an ink supply cartridge having a printhead mounted within the cartridge, said printhead being of the type having a plurality of parallel channels, each channel being supplied with ink and having one open end which serves as an ink droplet ejecting nozzle, a heating element being positioned in each channel a predetermined distance from the nozzle, ink droplets being ejected from the nozzles by the selective application of the current pulses to the heating elements in respond to signals from a remote source, the heating elements transferring thermal energy to the ink in contact therewith causing the formation and collapse of temporary vapor bubbles that expel the ink droplets, said printing device further comprising a first electrode board bonded to said printhead and mechanically connected to said cartridge, said first electrode board providing electrical connection between said heating elements and a plurality of terminals located at discrete points on both surfaces of said first board, said printing device further comprising a second electrode board in mechanical and electrical contact with said first board, said second board providing electrical connection between said first board terminals and said remote source.

DESCRIPTION OF THE INVENTION

Figure 3:
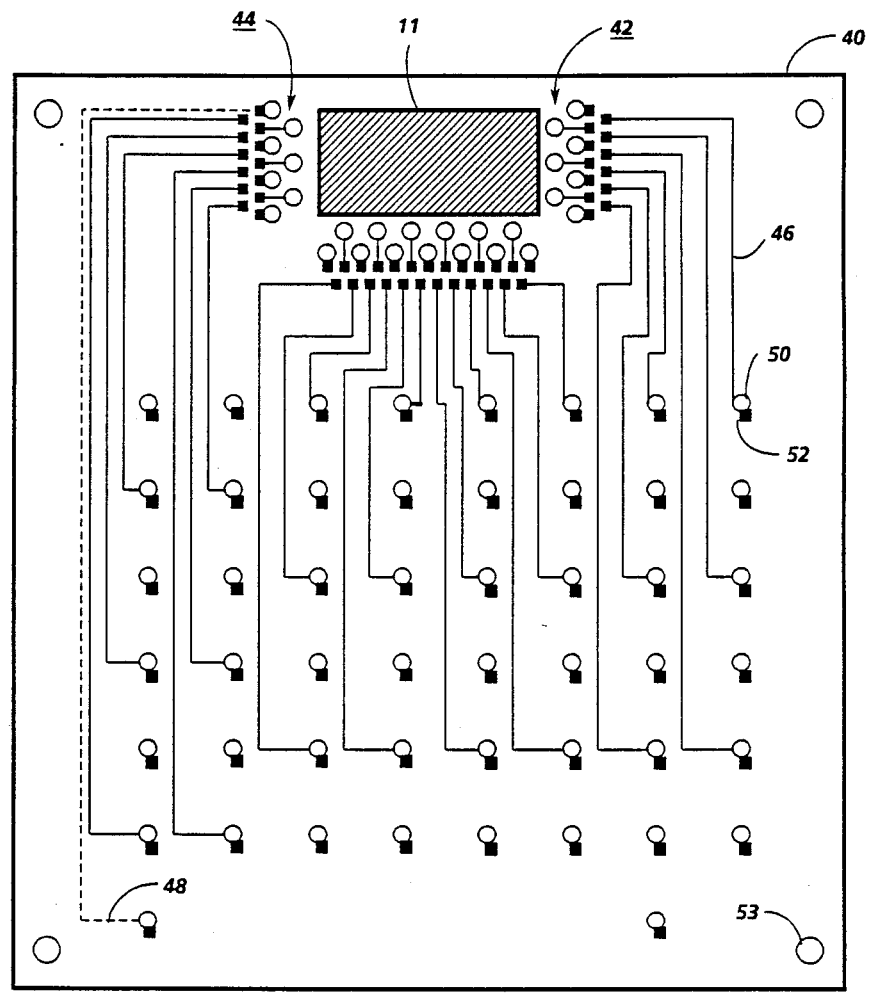
FIG. 3 is a top view of an electrode board designed according to the principles of the present invention to which a printhead of the type shown in FIG. 2 is bonded.
Figure 4:
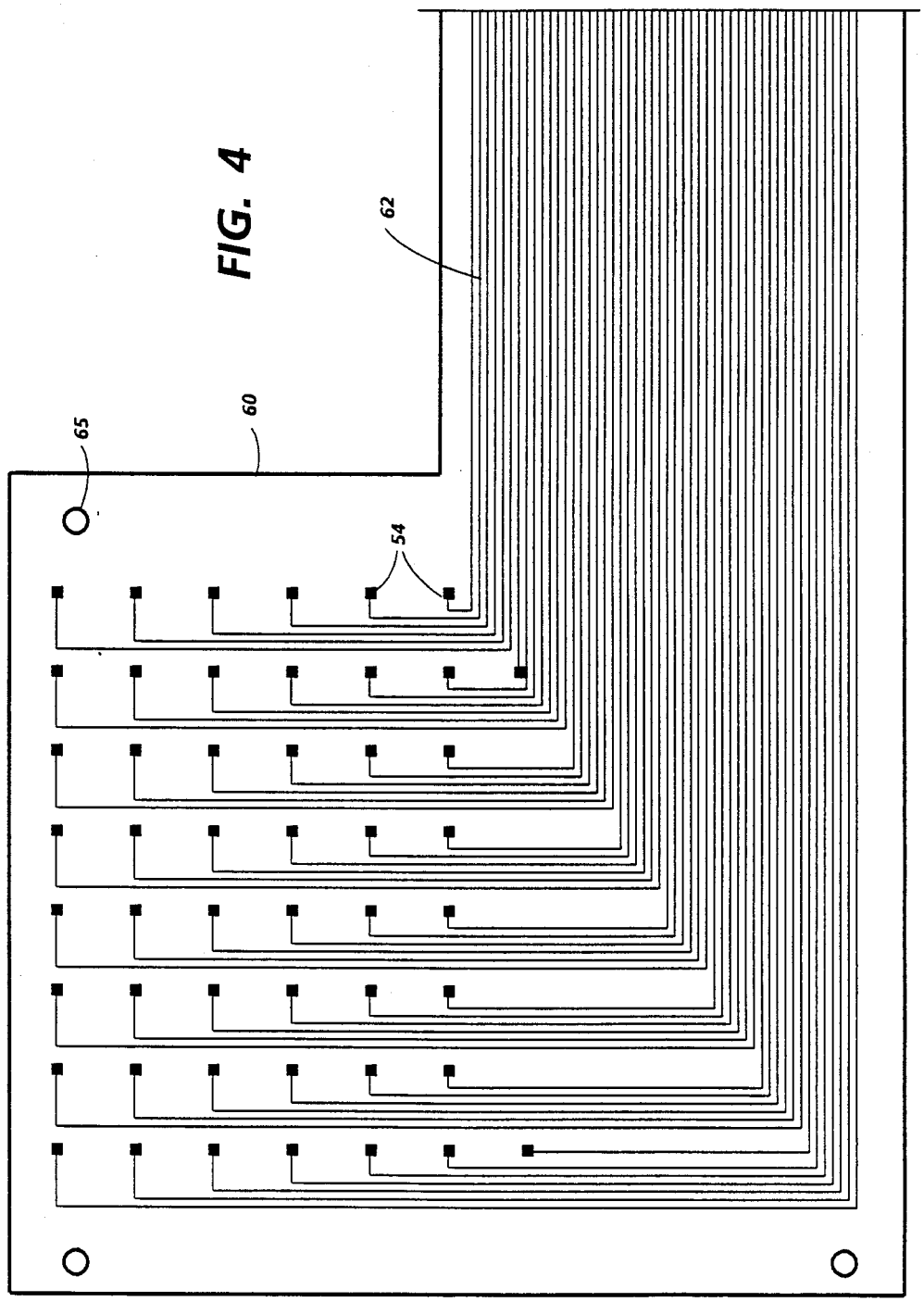
FIG. 4 is a top view of a second flexible electrode board held in mechanical and electrical contact with the first board.
Figure 5:
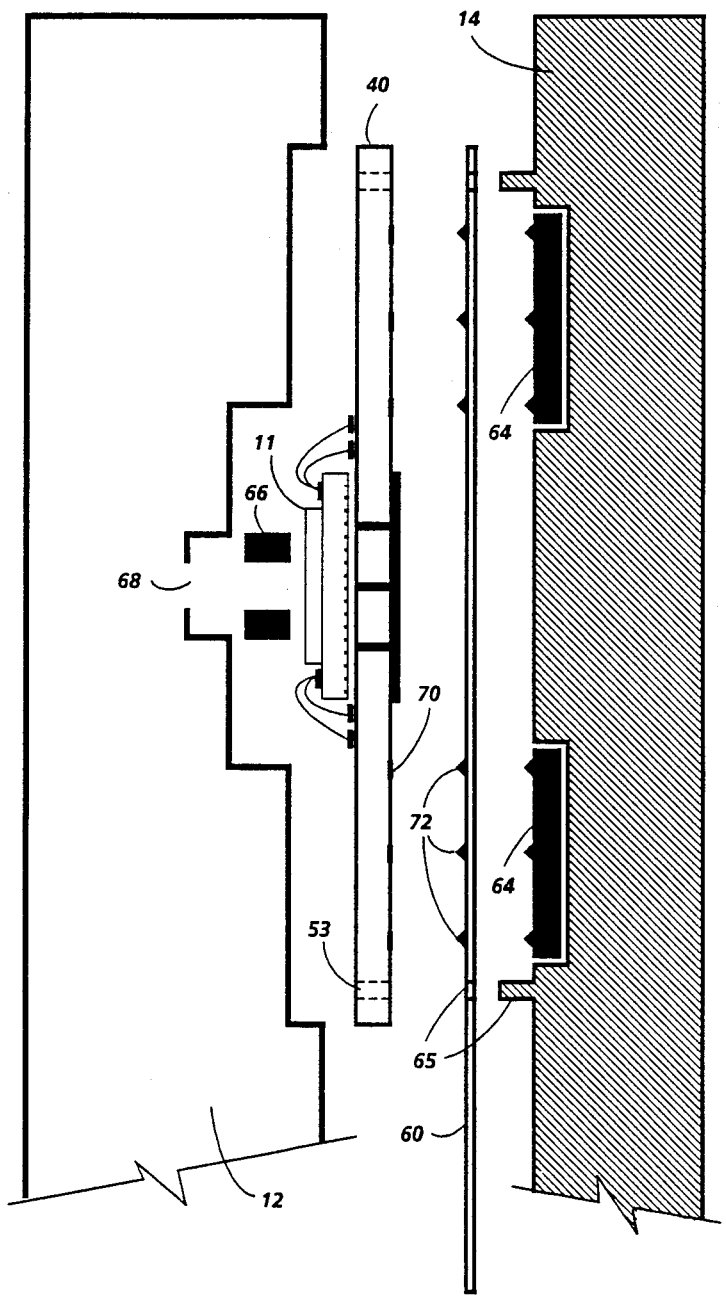
FIG. 5 is a front view showing the sandwich assembly of an ink cartridge, printhead, a first rigid and second flexible electrode board.

FIG. 3 shows a modified daughterboard design. FIG. 4 shows a flexible printed circuit board which is mechanically aligned with and electrically connected to a modified daughterboard. FIG. 5 shows a exploded front view of the assembly comprising a prior art ink cartridge in printhead sandwiched together with the modified daughterboard and the flexible printed circuit.

Referring first to FIG. 3, daughterboard 40 now has a printhead 11 centrally located at the print edge. A plurality of staggered wire bonding pads 42 and through holes 44 connect input lines 46, 48, (on backside of board 40) respectively, to through holes 50 and corresponding gold plated landing pads 52. Four precision drilled alignment holes 53 are formed at each corner of board 40. Pads 52 contact corresponding pads 54 on flexible printed circuit 60 shown in FIG. 4. Pads 54 are connected by electrodes 62 to the driver electronics. The pads 54 are raised from the surface by embossing the base material with "dimples" beneath the pad lands to ensure pad-to-pad contact. Rubber pads 64 with raised dimples are housed behind the flexed circuit 60. Electrical interconnection is then made as circuit 60 is sandwiched between the carriage 14 and daughterboard 40. Through alignment holes 65 are formed at three corners of circuit 50.

FIG. 5 shows a front cut away view of the printing assembly. Daughterboard 40 is held in contact with cartridge 12 by pressure against a rubber O ring 66. Printhead 11 is in contact with ink supply orifice 68. Pressure contact points between board 40 and circuit 60 are made at contacts 70 on the daughterboard and raised dimple pads 72 on the circuit board. The assembly is aligned in the X-Y direction by means of pins 65 placed through alignment holes 53. With the components fully assembled, as long as the pressure on rubber pad 64 is less than the pressure exerted by the O ring 66, the daughterboard remains vertical with respect to the carriage.

Figure 1:
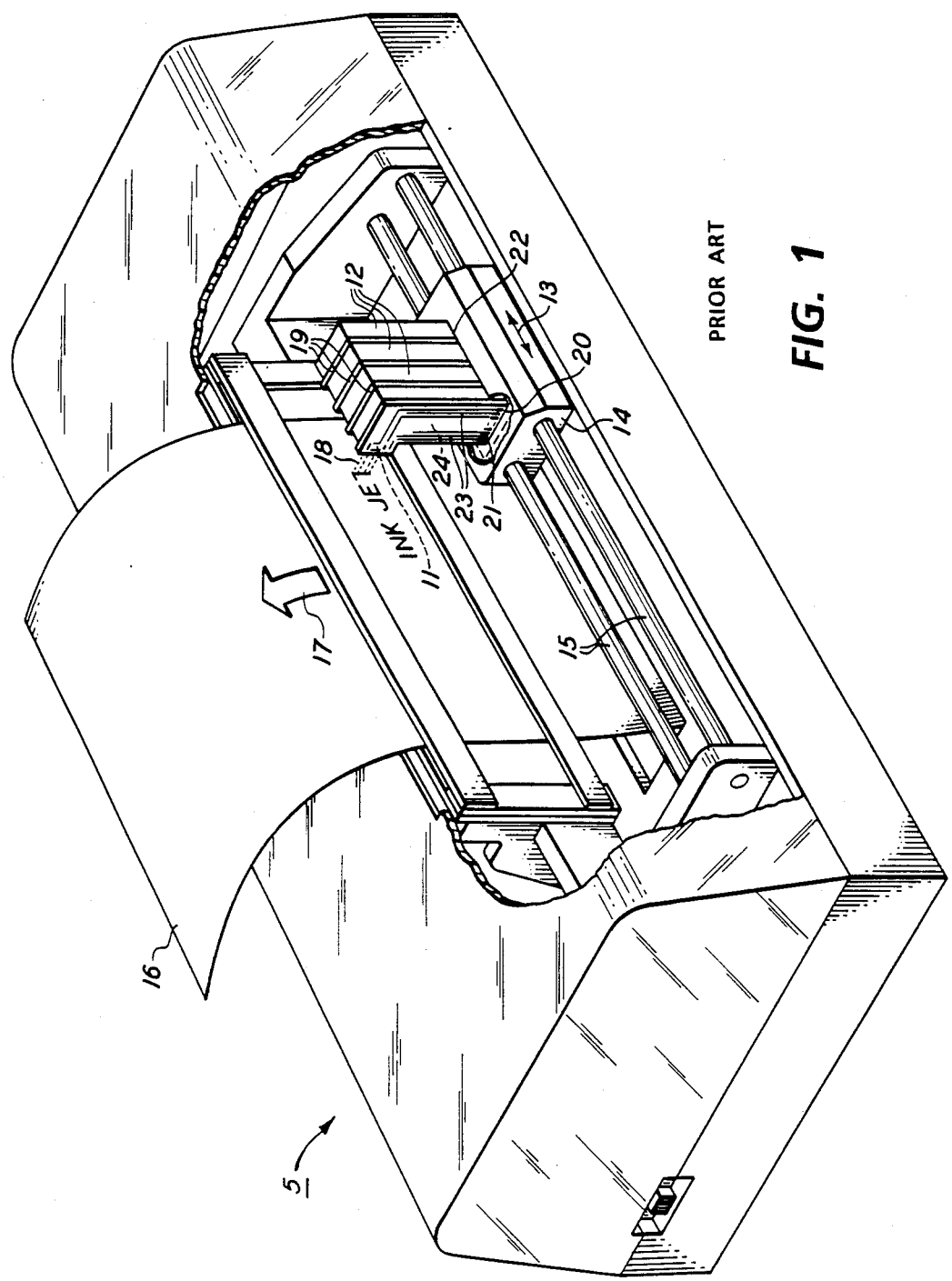
FIG. 1 is a schematic isometric view of a prior art thermal ink jet printing system.
Figure 2:
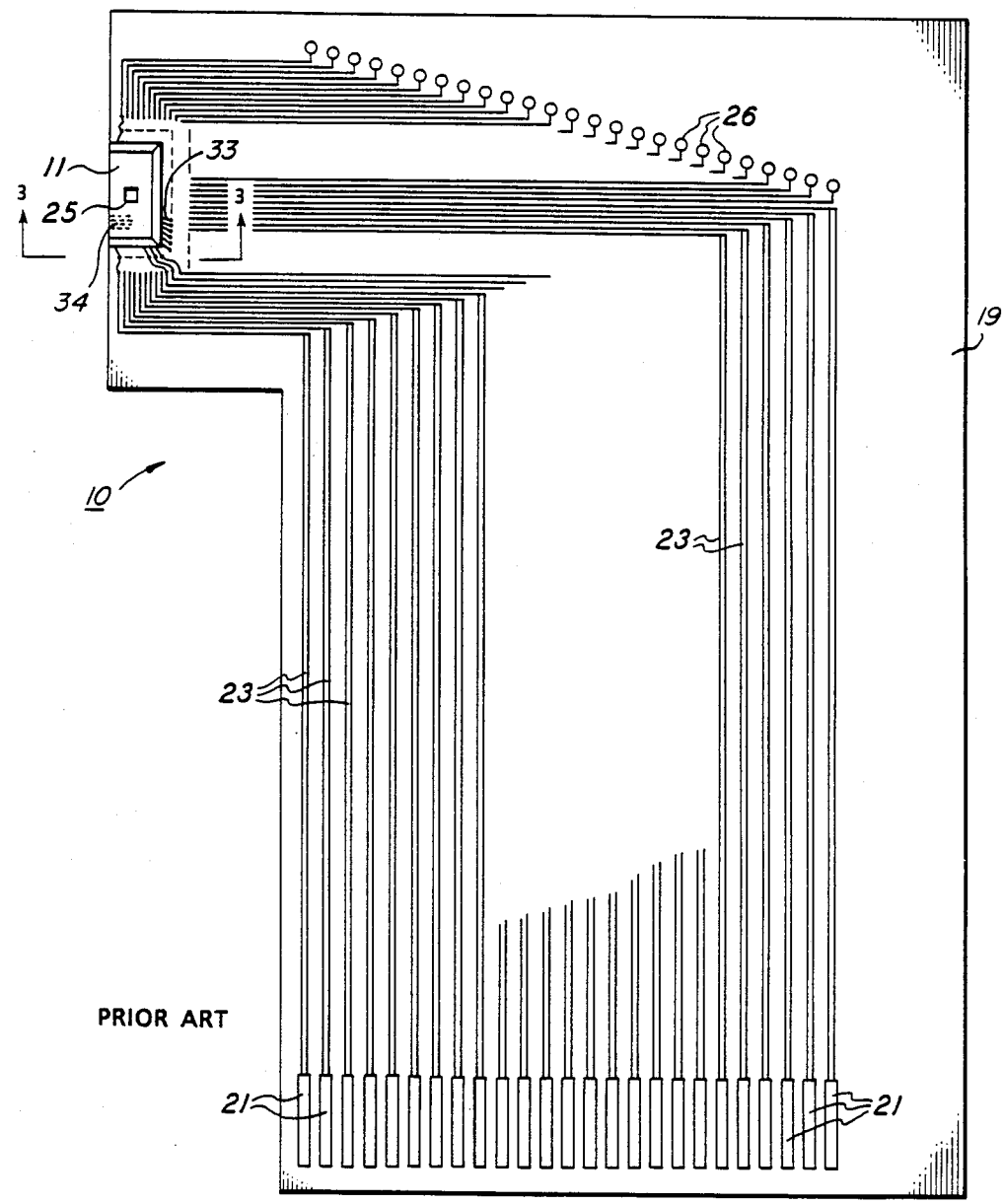
FIG. 2 is a plan view of the printing device shown in FIG. 1.

The above design enables a smaller size daughterboard than the prior art design of FIG. 1. Batch processing is enhanced since the size and shape of the new daughterboard allows more circuits to be packed on a PC board sheet with less waste. The expenses of a card edge connector are eliminated with the novel electrical/mechanical interconnect design. Line density is reduced on the daughterboard by using both sides of the PC board thereby permanently less expensive screen printing process. Alignment in X-Y and Φ directions is provided for in the design of the daughterboard and carriage. Finally, thermal performance is enhanced by filled in through holes leading to a pad which contacts a heat sinking metal carriage. While the invention has been described with reference to the structure disclosed, it is not confined to the specific details set forth but is intended to cover such modifications or changes as may come within the scope of the following claims.

What is claimed is:

1. An ink jet printing device for a drop-on-demand thermal ink jet printer, the printing device including an ink supply cartridge having a printhead mounted within the cartridge, said printhead being of the type having a plurality of parallel channels, each channel being supplied with ink and having one open end which serves as an ink droplet ejecting nozzle, a heating element being positioned in each channel a predetermined distance from the nozzle, ink droplets being ejected from the nozzles by the selective application of the current pulses to the heating elements in response to electrical signals from a remote source, the heating elements transferring thermal energy to the ink in contact therewith causing the formation and collapse of temporary vapor bubbles that expel the ink droplets, said printing device further comprising a first electrode board bonded to said printhead and mechanically connected to said cartridge, said first electrode board providing electrical connection between said heating elements and a plurality of terminals located at discrete points on both surfaces of said first board, said printing device further comprising a second electrode board in mechanical and electrical contact with said first board, said second board providing electrical connection between said first board terminals and said remote source.

2. The printing device of claim 1 in which said first and second boards have plated-through holes which transfer heat from the cartridge to a heat sink.

3. The printing device of claim 1 wherein the electrical connections on said first board are formed by a screen printing process.

4. The printing device of claim 1 wherein said first and second boards are aligned by a plurality of pins located in performed alignment holes.

5. The printing device of claim 1 wherein said first electrode board connects to the heater element input terminals by means of a plurality of staggered wire bonding pads and through holes.

6. The printing device of claim 1 wherein said second electrode board is flexible.

7. The printing device of claim 6 wherein the second electrical board contacts with the first board terminals along a plurality of dimpled conductive pads.

8. The printing device of claim 1 wherein said printhead is centrally located along the print edge of the first electrode board.

* * * * *